(12) United States Patent
Sugahara et al.

(10) Patent No.: US 7,960,186 B2
(45) Date of Patent: Jun. 14, 2011

(54) METHOD OF FORMING FERROMAGNETIC MATERIAL, TRANSISTOR AND METHOD OF MANUFACTURING THE SAME

(75) Inventors: Satoshi Sugahara, Kanagawa (JP); Yota Takamura, Kanagawa (JP)

(73) Assignee: Tokyo Institute of Technology, Tokyo (JP)

( * ) Notice: Subject to any disclaimer, the term of this patent is extended or adjusted under 35 U.S.C. 154(b) by 85 days.

(21) Appl. No.: 12/450,355

(22) PCT Filed: Mar. 26, 2008

(86) PCT No.: PCT/JP2008/055769
§ 371 (c)(1),
(2), (4) Date: Sep. 22, 2009

(87) PCT Pub. No.: WO2008/123321
PCT Pub. Date: Oct. 16, 2008

(65) Prior Publication Data
US 2010/0171158 A1    Jul. 8, 2010

(30) Foreign Application Priority Data
Mar. 26, 2007    (JP) .................. 2007-078925

(51) Int. Cl.
*H01L 21/00* (2006.01)
(52) U.S. Cl. ............. 438/3; 438/256; 257/295; 257/421; 257/E29.139; 257/E43.001; 365/158
(58) Field of Classification Search .................. 257/295, 257/421, 422, 424, 425, 426, E29.139, E43.001; 438/3, 256; 365/158, 171, 173
See application file for complete search history.

(56) References Cited

U.S. PATENT DOCUMENTS

| | | | |
|---|---|---|---|
| 5,861,069 A | 1/1999 | Lee | |
| 7,570,510 B2* | 8/2009 | Johnson | 365/158 |
| 7,602,636 B2* | 10/2009 | Saito et al. | 365/158 |
| 7,652,913 B2* | 1/2010 | Sugiyama et al. | 365/158 |
| 7,714,400 B2* | 5/2010 | Sugahara et al. | 257/421 |
| 2004/0052006 A1* | 3/2004 | Odagawa et al. | 360/324.1 |
| 2005/0088787 A1* | 4/2005 | Takahashi et al. | 360/324.2 |

(Continued)

FOREIGN PATENT DOCUMENTS

JP    A-10-183349    7/1998

(Continued)

OTHER PUBLICATIONS

Koichiro Inomata, "Chapter 12 Half Metal Usumaku to TMR," Spinelectronics-Basic and Forefront, First Edition, CMC Publishing Co., Ltd., 2004, pp. 141-153.
T. Ambrose et al., "Magnetic Properties of Single Crystal Co2MnGe Heusler Alloy Films," Journal of Applied Physics, vol. 87, No. 9, 2000, pp. 5463-5465.
M. P. Raphael et al., "Magnetic, Structural, and Transport Properties of Thin Film and Single Crystal Co2MnSi," Applied Physics Letters, vol. 79, No. 26, 2001, 2001, pp. 4396-4398.

(Continued)

*Primary Examiner* — Fernando L Toledo
(74) *Attorney, Agent, or Firm* — Oliff & Berridge, PLC

(57) ABSTRACT

The disclosure provides a method of forming a ferromagnetic material, including: forming a magnetic element layer on a semiconductor layer formed on an inhibition layer; and forming a ferromagnetic layer of a Heusler alloy layer on the inhibition layer by heat treatment to induce the semiconductor layer and the magnetic element layer to react with each other, and a transistor, and a method of manufacturing the same. The inhibition layer for inhibiting a reaction of the semiconductor layer and the magnetic element layer restricts a semiconductor to be supplied for a reaction of the semiconductor and the magnetic element. Therefore, it is possible to form a ferromagnetic material having a high composition ratio of a magnetic element.

21 Claims, 12 Drawing Sheets

U.S. PATENT DOCUMENTS

| | | | |
|---|---|---|---|
| 2006/0220161 A1 | 10/2006 | Saito et al. | |
| 2008/0061332 A1* | 3/2008 | Saito et al. | 257/295 |
| 2008/0061869 A1* | 3/2008 | Takatori | 327/544 |
| 2009/0236646 A1* | 9/2009 | Sugahara et al. | 257/295 |

FOREIGN PATENT DOCUMENTS

| | | |
|---|---|---|
| JP | A-2005-228998 | 8/2005 |
| JP | A-2006-286726 | 10/2006 |

OTHER PUBLICATIONS

S. Sugahara, "Spin Metal-Oxide-Semiconductor Field-Effect Transistors (Spin MOSFETs) For Intergrated Spin Electronics," IEE Proceedings-Circuits, Devices and Systems, vol. 152, No. 4, 2005, pp. 355-365.

S. Sugahara, "Perspective on Field-Effect Spin-Transistors," Phys. Stat. Sol., (c) 3, No. 12, 2006, pp. 4405-4413.

* cited by examiner

METHOD OF FORMING FERROMAGNETIC MATERIAL, TRANSISTOR AND METHOD OF MANUFACTURING THE SAME

TECHNICAL FIELD

The present invention relates to a method of forming a ferromagnetic material, a transistor and a method of manufacturing the same. More particularly, the present invention relates to a method of forming a ferromagnetic material, a transistor and a method of manufacturing the same in which a ferromagnetic layer of a Heusler alloy is formed on an inhibition layer.

BACKGROUND ART

Heusler alloys have been known as a half-metallic ferromagnet. Heusler alloys include a full-Heusler alloy and a half-Heusler alloy. FIG. 1 is a diagram showing the $L2_1$-type crystal structure of $Co_2FeSi$, which is a full-Heusler alloy. Thus, a full-Heusler alloy has the composition of $X_2YZ$. A half-Heusler alloy has the $C1_b$-type crystal structure and has the composition of XYZ. Here, elements such as Co (cobalt) and Ni (nickel) can be used as X. Elements such as Fe (iron), Cr (chromium), and Mn (manganese) can be used as Y. Elements such as Si (silicon) and Ge (germanium) can be used as Z. For example, the Curie temperature of $Co_2FeSi$, which is a full-Heusler alloy, is not less than room temperature. Thus, $Co_2FeSi$ can be used as a half-metallic ferromagnet at room temperature. Heretofore, a Heusler alloy has been produced by a sputtering method or a molecular beam epitaxy method.

For example, a half-metallic ferromagnet is used as a source electrode and a drain electrode of a spin-transistor as disclosed in Non-Patent Literatures 1 and 2. Because the half-metallic ferromagnet can have a spin polarization of 100% at the Fermi level, a spin-transistor using a half-metallic ferromagnet for a source electrode and a drain electrode can obtain a high magnetocurrent ratio. On the other hand, Non-Patent Literatures 1 and 2 disclose a spin-transistor using an SOI (Silicon-on-Insulator) substrate.

[Non-Patent Literature 1] S. Sugahara, IEE Proc.—Circuits Devices Syst., Vol. 152, No. 4, 2005, pp. 355-365
[Non-Patent Literature 2] S. Sugahara, Phys. Stat. Sol. (c) 3, No. 12, 2006, pp. 4405-4413

DISCLOSURE OF THE INVENTION

Problem to be Solved by the Invention

In a MOSFET-type spin-transistor, it is preferable to form a half-metallic ferromagnetic layer of a Heusler alloy in which a magnetic element layer has been silicided (or germanided) as a source electrode and a drain electrode from the viewpoint of the transistor performance (current drivability) or the spin (magnetization) dependent transport characteristics (magnetocurrent ratio). In order to use a Heusler alloy as a source electrode and a drain electrode of a spin-transistor disclosed in Non-Patent Literatures 1 and 2, the Heusler alloy should be formed in an area adjacent to a semiconductor layer. However, when a Heusler alloy is formed as a source electrode and a drain electrode by using the conventional sputtering method or the conventional molecular beam epitaxy method, the Heusler alloy is formed on a surface of Si.

For manufacturing a MOSFET-type spin-transistor, it is preferable to form a half-metallic ferromagnet by the same process as the conventional manufacturing process of a MOSFET. Furthermore, it is preferable for a spin-transistor to have a similar structure to that of a MOSFET having a metal source and a metal drain.

The present invention has been made in view of the above drawbacks. It is, therefore, an object of the present invention to provide a method of forming a ferromagnetic material and a method of manufacturing a transistor which can form a ferromagnetic layer of a Heusler alloy adjacent to a semiconductor layer.

Means for Solving the Problem

The present invention includes a method of forming a ferromagnetic material characterized by including: a step of forming a magnetic element layer on a semiconductor layer formed on an inhibition layer; and a step of forming a ferromagnetic layer of a Heusler alloy on the inhibition layer by heat treatment to induce the semiconductor layer and the magnetic element layer to react with each other. According to the present invention, an inhibition layer is formed for inhibiting a reaction of a magnetic element and a semiconductor layer. A magnetic element layer is formed on the inhibition layer. A semiconductor layer and the magnetic element layer are induced to react with each other. Thus, the amount of semiconductor to be supplied is restricted, making it possible to form a Heusler alloy having a high composition ratio of a magnetic element. Accordingly, it is possible to form a ferromagnetic material having a high spin polarization.

The above structure may be modified so that the semiconductor layer contains at least one of silicon and germanium. With this configuration, a ferromagnetic material can be formed by using the same method as the technique for forming a metal source and a metal drain of a MOSFET.

The above structure may be modified so that the inhibition layer includes a silicon oxide film. With this configuration, a silicon oxide film, which is stable at high temperatures, can be used for the inhibition layer.

The above structure may be modified so that the inhibition layer is formed by a silicon substrate, and the semiconductor layer contains germanium. With this configuration, a Heusler alloy of germanium and a magnetic element can be formed by using a germanium layer, which is likely to react with magnetic elements at a low temperature, as the semiconductor layer and a silicon substrate, which is less likely to react with magnetic elements than germanium, as the inhibition layer.

The above structure may be modified so that the step of forming the magnetic element layer includes a step of forming the magnetic element layer selectively on the semiconductor layer, and a step of forming the ferromagnetic layer comprises forming the ferromagnetic layer selectively on the inhibition layer. With this configuration, the semiconductor layer and the ferromagnetic layer can be formed selectively on the inhibition layer.

The present invention includes a method of manufacturing a transistor characterized by including: a step of forming a magnetic element layer selectively on a semiconductor layer formed on an inhibition layer at one or both sides of an area to be a channel in the semiconductor layer; and a step of forming a ferromagnetic electrode of a Heusler alloy on the inhibition layer by heat treatment to induce the semiconductor layer and the magnetic element layer to react with each other. According to the present invention, electrodes of a transistor can be formed of a ferromagnetic material of a Heusler alloy.

The above structure may be modified so that the ferromagnetic electrode comprises a source electrode and a drain electrode.

The above structure may be modified so as to include a step of forming a semiconductor area between the semiconductor channel and the ferromagnetic electrode, the semiconductor area containing a dopant at a concentration higher than that of the semiconductor channel. With this configuration, it is possible to form an area having a higher carrier concentration between the semiconductor channel and the ferromagnetic electrode. Therefore, the transistor performance can be improved.

The above structure may be modified so as to include a step of forming a segregation layer between the semiconductor channel and the ferromagnetic electrode. With this configuration, an interface between the semiconductor channel and the ferromagnetic electrode can be controlled by the segregation layer. For example, it is possible to reduce a Schottky barrier height.

The above structure may be modified so as to include a step of forming a gate electrode in an area to be the channel and a sidewall on both sides of the gate electrode, and so that the step of forming a ferromagnetic electrode includes a step of forming the ferromagnetic electrode such that the ferromagnetic electrode extends so as to erode a portion located below the sidewall. With this configuration, a parasitic resistance can be eliminated so as to improve the transistor performance.

The present invention is characterized by including: a transistor comprising: a semiconductor channel layer provided on an inhibition layer; a ferromagnetic electrode provided on the inhibition layer at one or both sides of the semiconductor channel, the ferromagnetic electrode being formed of a Heusler alloy including a semiconductor constituting the semiconductor channel and a magnetic element. According to the present invention, a ferromagnetic electrode of a Heusler alloy can be formed with a semiconductor constituting a semiconductor channel and a magnetic element. Therefore, a ferromagnetic electrode having a high spin polarization can be used to obtain a high magnetocurrent ratio.

The above structure may be modified so as to include a semiconductor area between the semiconductor channel and the ferromagnetic electrode, the semiconductor area including a dopant at a concentration higher than that of the semiconductor channel. With this configuration, the transistor performance can be improved.

The above structure may be modified so as to include a segregation layer between the semiconductor channel and the ferromagnetic electrode.

The above structure may be modified so as to include a gate electrode provided on the semiconductor channel and a sidewall formed on both sides of the gate electrode, so that the ferromagnetic electrode extends so as to erode a portion located below the sidewall. The transistor performance can be improved.

EFFECT OF THE INVENTION

According to the present invention, an inhibition layer is formed for inhibiting a reaction of a magnetic element and a semiconductor layer. A magnetic element layer is formed on the inhibition layer. A semiconductor layer and the magnetic element layer are induced to react with each other. As a result, the amount of semiconductor to be supplied is restricted, making it possible to form a Heusler alloy having a high composition ratio of a magnetic element. Therefore, it is possible to form a ferromagnetic material having a high spin polarization.

BEST MODES FOR CARRYING OUT THE INVENTION

Figure 2A:
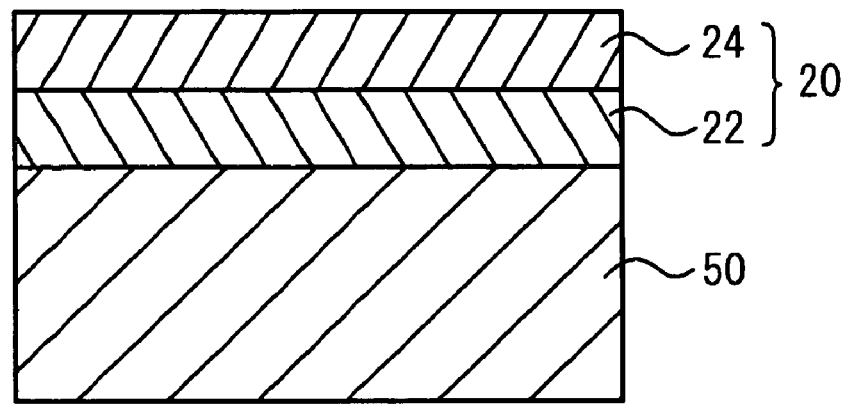
FIGS. 2(a) and 2(b) are diagrams showing that a silicide magnetic alloy is formed directly on a Si substrate.
Figure 2B:
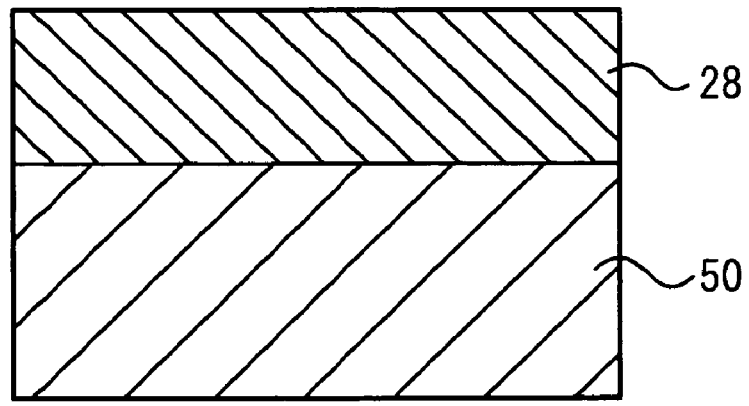

FIGS. 2(a) and 2(b) show a generally conceivable method of forming an alloy containing Co, Fe, and Si as an example of a ferromagnetic Heusler alloy. Referring to FIG. 2(a), a Co layer 22 and an Fe layer 24 are formed on a Si substrate 50 by an evaporation method. Referring to FIG. 2(b), heat treatment using an RTA (Rapid Thermal Annealing) method is performed, so that the Co layer 22, the Fe layer 24, and the Si substrate 50 react to form an alloy 28 containing Co, Fe, and Si.

This alloy 28 is not a Heusler alloy and is a non-magnetic material with low composition ratios of magnetic elements (Co and Fe). Although a Heusler alloy is in a thermodynamically stable phase, an alloy having low composition ratios of magnetic elements has a free energy lower than a Heusler alloy. Therefore, if Si is supplied from the Si substrate 50, the formed alloy becomes a non-magnetic alloy having low composition ratios of magnetic elements.

According to the present invention, an inhibition layer is formed for inhibiting a reaction of a magnetic element and a semiconductor substrate such as Si. A magnetic element layer is formed on the inhibition layer. A semiconductor layer and the magnetic element layer are induced to react with each other. As a result, the amount of semiconductor to be supplied is restricted, making it possible to form a Heusler alloy having a high composition ratio of a magnetic element. Several embodiments of the present invention will be described below.

Embodiment 1

Figure 3A:
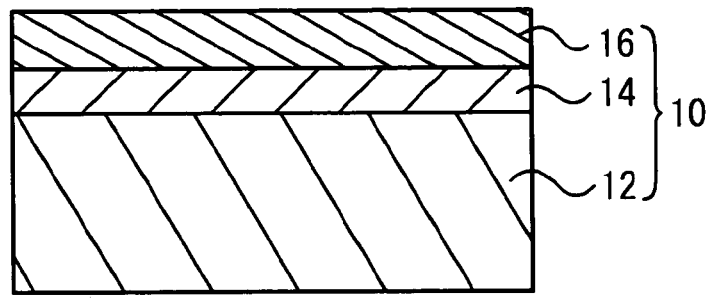
FIGS. 3(a) to 3(c) are diagrams showing a method of forming a ferromagnetic material according to Embodiment 1.
Figure 3B:
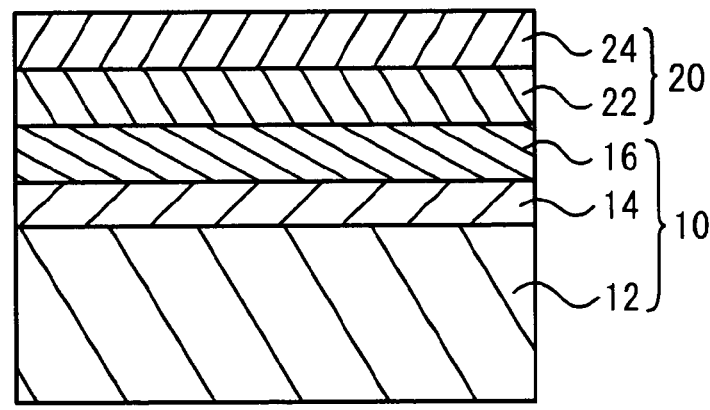
Figure 3C:
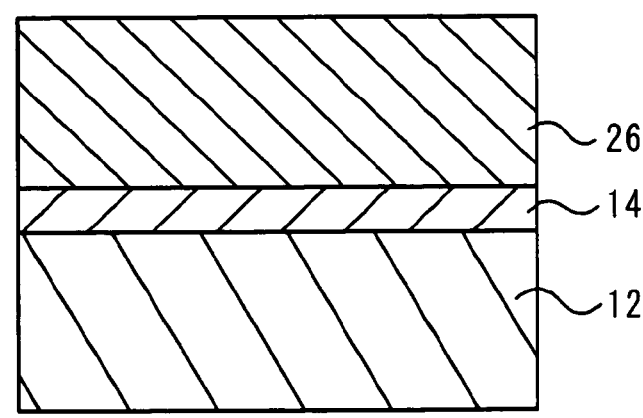

Embodiment 1 is an embodiment of a method of forming a ferromagnetic material with use of an SOI (Silicon-on-Insulator) substrate. FIGS. 3(a) to 3(c) show a method of forming a ferromagnetic material according to Embodiment 1. Referring to FIG. 3(a), an SOI substrate 10 including a Si substrate 12, a silicon oxide layer 14 (inhibition layer) of $SiO_2$ as a buried oxide film, and a Si layer 16 (semiconductor layer), which are formed sequentially, is prepared. Referring to FIG.

3(b), a Co layer 22 and an Fe layer 24 are formed on the SOI substrate 10 by an evaporation method. Thus, a magnetic element layer 20 including the Co layer 22 and the Fe layer 24 is formed on the Si layer 16. At that time, the thickness of the Si layer 16, the Co layer 22, and the Fe layer 24 is set such as to supply atoms stoichiometrically enough to form $Co_2FeSi$ when each layer reacts entirely. In Embodiment 1, the thickness of the Si layer 16, the Co layer 22, and the Fe layer was set at 40 nm, 45 nm, and 24 nm, respectively. The magnetic element layer 20 may be any layer containing a magnetic element. For example, the magnetic element layer 20 may be an alloy layer of Co and Fe.

Referring to FIG. 3(c), heat treatment using an RTA method is performed to form an alloy layer 26. RTA was performed in a nitrogen atmosphere for about 4 minutes. The heat treatment temperature will be described later. Because the silicon oxide layer 14 is extremely thermostable, it does not react at temperatures at which the other layers react. Therefore, only the Si layer 16, the Co layer 22, and the Fe layer 24, which are located above the silicon oxide layer 14, react to each other. Accordingly, the formed alloy layer 26 has a stoichiometric composition of $Co_2FeSi$.

Figure 1:
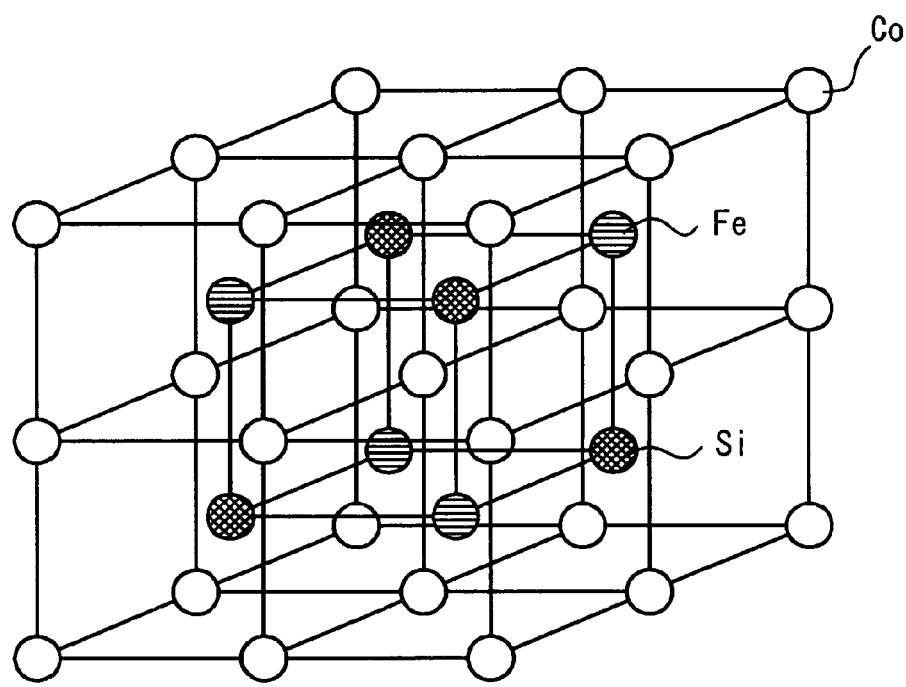
FIG. 1 is a diagram showing the $L2_1$ crystal structure of a full-Heusler alloy.

The crystal structure of $Co_2FeSi$, which is a Heusler alloy, includes an $L2_1$ structure shown in FIG. 1, a B2 structure in which atoms of Si and Fe in FIG. 1 are randomly arranged, and an A2 structure in which atoms of Co, Fe, and Si in FIG. 1 are randomly arranged. The $L2_1$ structure has the highest spin polarization and is a preferred structure. Measurement using an X-ray diffraction method was performed in order to examine the crystal structure of $Co_2FeSi$ produced in Embodiment 1. Referring to Table 1, all of the (220) primitive lattice line, the (200) superlattice line, and the (111) superlattice line are observed in the case of the $L2_1$ structure. In the case of the B2 structure, the (220) primitive lattice line and the (200) superlattice line are observed while the (111) superlattice line is not observed. In the case of the A2 structure, the (220) primitive lattice line is observed while the (200) superlattice line and the (111) superlattice line are not observed.

TABLE 1

|  | A2 Structure | B2 Structure | $L2_1$ Structure |
| --- | --- | --- | --- |
| (220) Primitive Lattice Line | Observed | Observed | Observed |
| (200) Superlattice Line | Disappeared | Observed | Observed |
| (111) Superlattice Line | Disappeared | Disappeared | Observed |

Figure 4:
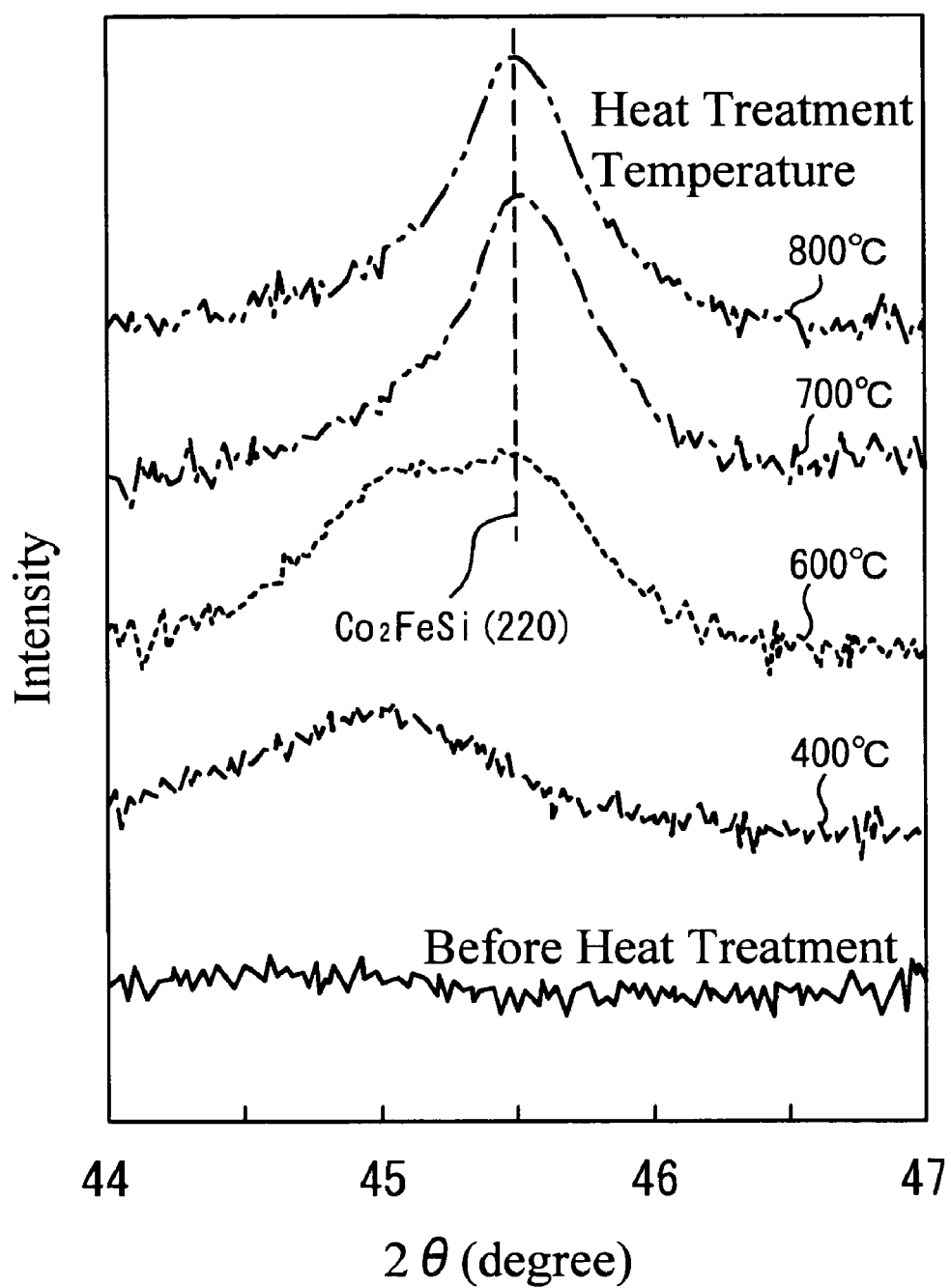
FIG. 4 is a graph showing X-ray diffraction intensities with varied heat treatment temperatures.

FIG. 4 shows results of an X-ray diffraction of samples subjected to RTA under several heat treatment temperatures. Before the heat treatment, no diffracted rays were observed. The (220) primitive lattice line of $Co_2FeSi$ was observed in a case where the heat treatment temperature was 600° C. When the heat treatment temperature was 700° C. or more, the observed line was mostly the (220) primitive lattice line of $Co_2FeSi$. It was confirmed from these results that $Co_2FeSi$ having the Heusler alloy structure with the body-centered cubic lattice (BCC) was formed at a heat treatment temperature of 700° C. or more.

Figure 5:
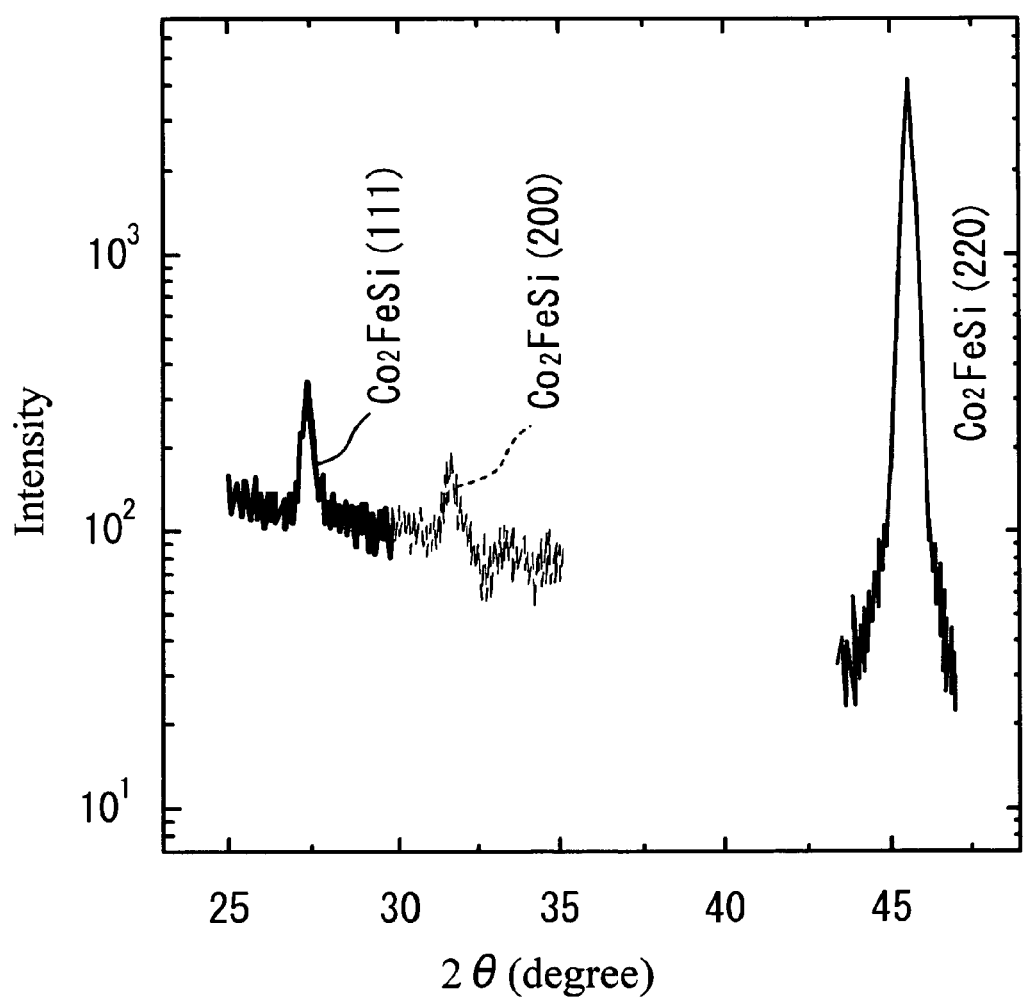
FIG. 5 is a graph showing X-ray diffraction intensities with varied X-ray diffraction angles.

FIG. 5 shows measurement results of the (200) superlattice line and the (111) superlattice line of a sample subjected to heat treatment under a temperature of 700° C. Referring to FIG. 5, the (200) superlattice line and the (111) superlattice line were observed in addition to the (220) primitive lattice line. Thus, it was confirmed that $Co_2FeSi$ produced in Embodiment 1 was a Heusler alloy having the $L2_1$ structure.

Figure 6:
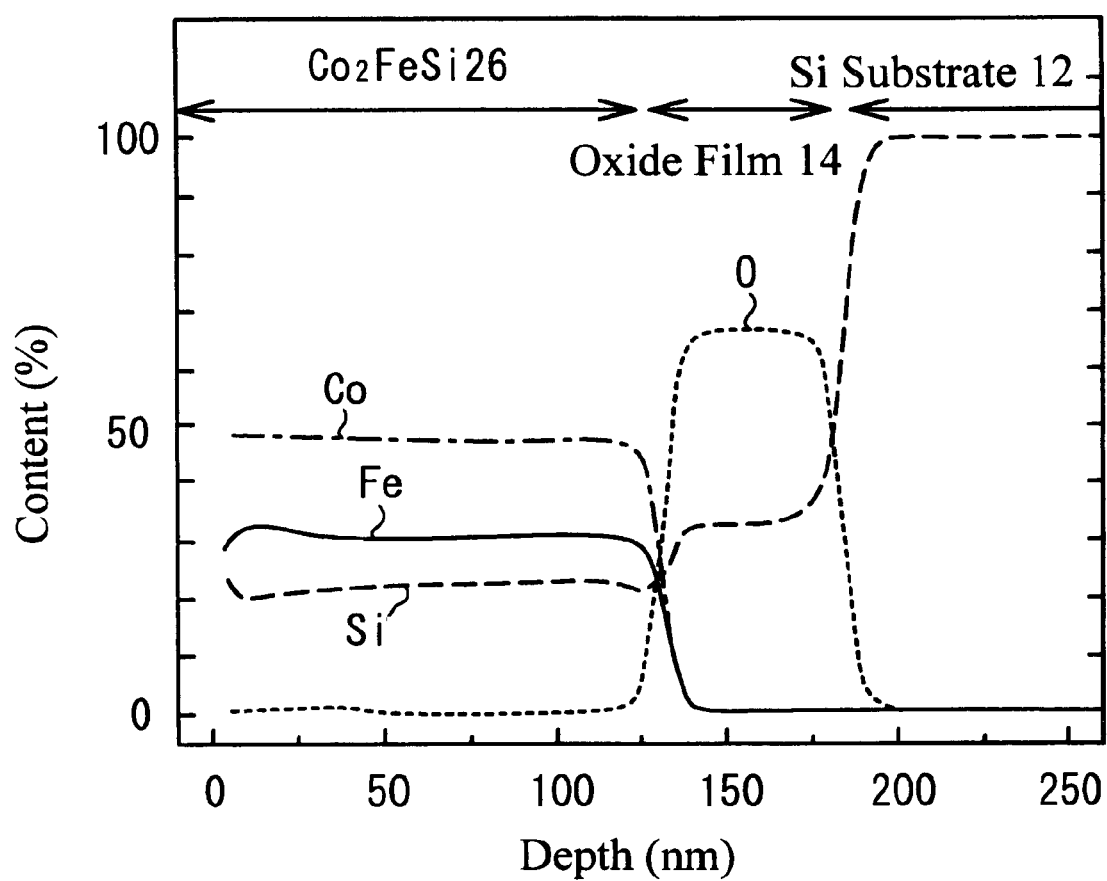
FIG. 6 is a graph showing a content of each atom with respect to the depth which was measured by using SIMS.

FIG. 6 shows measurement results of SIMS (Secondary Ion Mass Spectrometry) of a sample subjected to heat treatment under a temperature of 700° C. The horizontal axis represents the depth from a surface of the sample, whereas the vertical axis represents the content (atomic %) of each atom. Co and Fe were not observed at a portion lower than the silicon oxide layer 14 (rightward in FIG. 6). This shows that the silicon oxide layer 14 and the Si substrate 12 did not react with Co or Fe. Specifically, it is conceivable that most of atoms constituting the $Co_2FeSi$ alloy layer 26 were supplied from the Si layer 16, the Co layer 22, and the Fe layer 24. The composition ratio of the alloy layer 26 was close to Co:Fe:Si=50:25:25, which is the stoichiometric composition of the alloy layer 26. A Heusler alloy having the completely stoichiometric composition can be obtained by adjusting the film thickness of the Si layer 16, the Co layer 22, and the Fe layer 24. As described above, according to Embodiment 1, the half-metallic ferromagnetic layer of the Heusler alloy layer 26 could be formed on the silicon oxide layer 14.

Embodiment 2

Figure 7A:
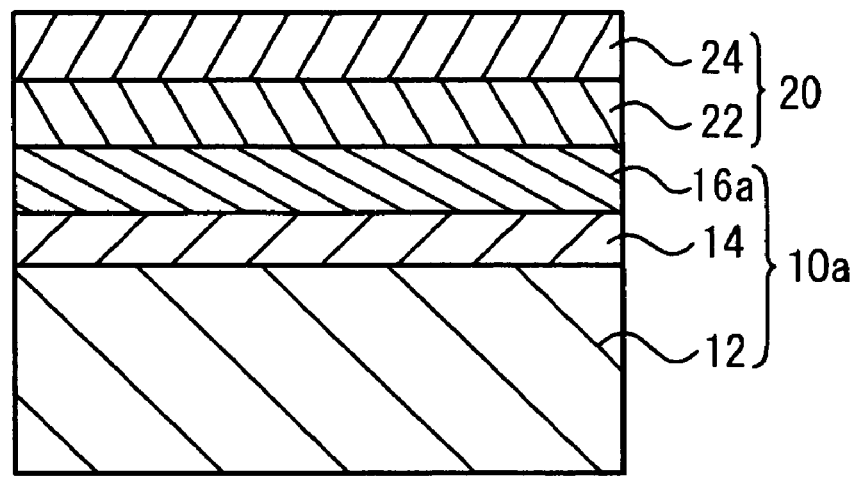
FIGS. 7(a) and 7(b) are diagrams showing a method of forming a ferromagnetic material according to Embodiment 2.
Figure 7B:
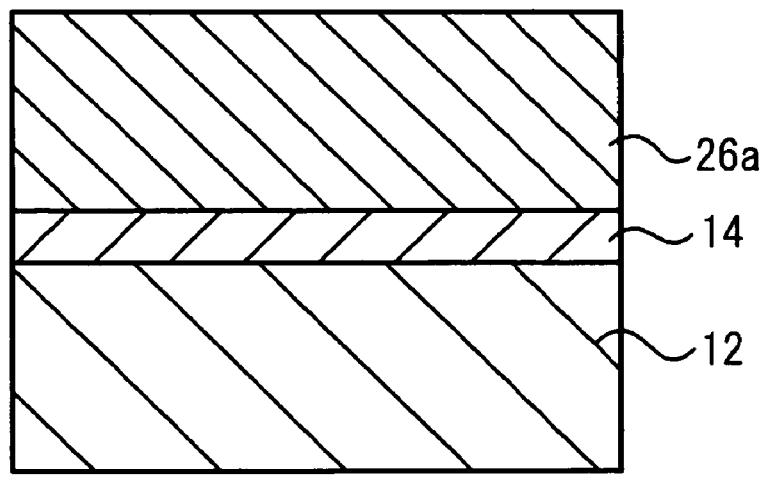

Embodiment 2 is an embodiment of the method of forming a ferromagnetic material with use of a GOI (Germanium-on-Insulator) substrate. FIGS. 7(a) and 7(b) show a method of forming a ferromagnetic material according to Embodiment 2. Referring to FIG. 7(a), a magnetic element layer 20 including a Co layer 22 and an Fe layer 24 is formed on a GOI substrate 10a, which includes a Si substrate 12, a silicon oxide layer 14 formed on the Si substrate 12, and a Ge (germanium) layer 16a formed on the silicon oxide layer 14, by a deposition method.

Referring to FIG. 7(b), heat treatment using an RTA method is performed to induce the Ge layer 16a, the Co layer 22, and the Fe layer 24 to reach with each other. Thus, a $Co_2FeGe$ alloy layer 26a having the Heusler alloy structure is formed.

Embodiment 3

Figure 8A:
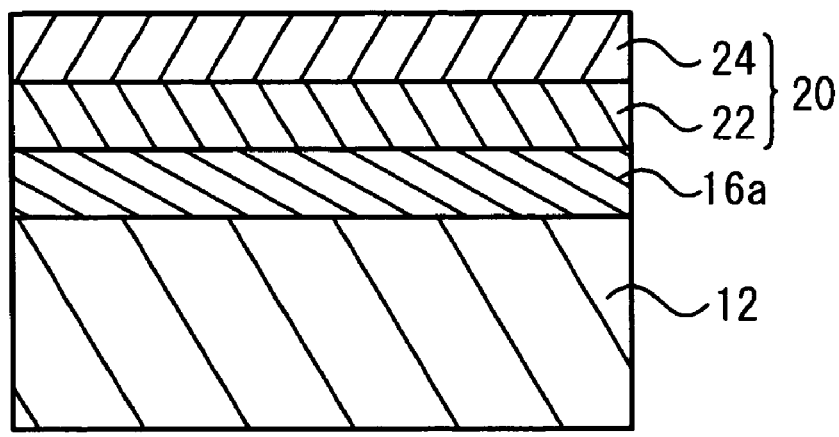
FIGS. 8(a) and 8(b) are diagrams showing a method of forming a ferromagnetic material according to Embodiment 3.
Figure 8B:
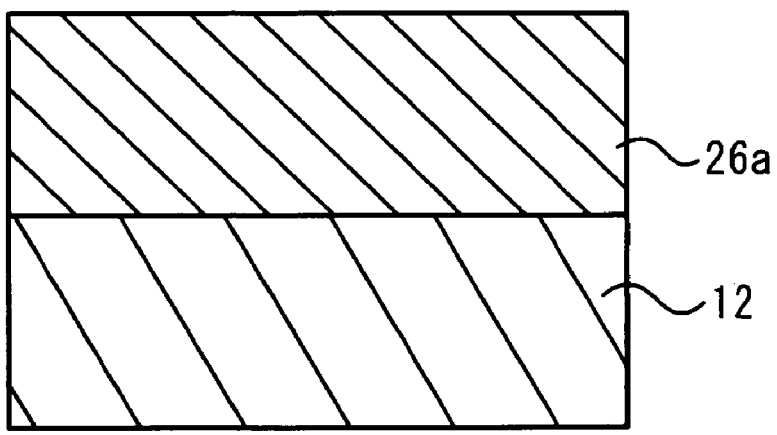

Embodiment 3 is an embodiment of a method of forming a ferromagnetic material with use of a Ge layer on a Si substrate. Referring to FIG. 8(a), a Ge layer 16a, a Co layer 22, and an Fe layer 24 are formed on a Si substrate 12. Referring to FIG. 8(b), a $Co_2FeGe$ alloy layer 26a having the Heusler alloy structure can be formed at a temperature at which Si does not react with Ge or with Co or Fe. For example, temperatures at which Si does not react with Ge or with Co or Fe but Ge reacts with Co and Fe may include a range from about 300° C. to about 400° C.

According to Embodiment 3, the Ge layer 16a, which is likely to react with magnetic elements at a low temperature, is used as a semiconductor layer. The Si substrate 12, which is less likely to react with magnetic elements than Ge at a low temperature, is used as an inhibition layer. In this case, it is possible to form a Heusler alloy of Ge and magnetic elements. Thus, a Heusler alloy can be formed without use of an expensive SOI substrate or an expensive GUI substrate.

As with Embodiments 1 and 2, a $Co_2FeGe_{0.5}Si_{0.5}$ alloy having the Heusler alloy structure can also be formed with use of an SGOI (SiGe-on-Insulator). Furthermore, a half-Heusler alloy having a $C1_b$ structure, such as CoFeSi or CoFeGe, can be formed as a Heusler alloy. Moreover, it is also possible to form a quaternary Heusler alloy such as $Co_2FeAl_{0.5}Si_{0.5}$.

A Heusler alloy of Si or Ge and a magnetic element can be formed by using a layer containing Si or Ge as a semiconductor layer.

In Embodiments 1 and 2, the silicon oxide layer 14 is used as an inhibition layer. In Embodiment 3, the Si substrate 12 is used as an inhibition layer. The inhibition layer may be any layer that can inhibit reaction of the semiconductor substrate such as the Si layer 16 or the Ge layer 16a with the Co layer 22 and the Fe layer 24. For example, an insulating film other than a silicon oxide layer can be used as an inhibition layer. In such a case, a semiconductor layer on the inhibition layer reacts with a magnetic element layer, making it possible to form a half-metallic ferromagnetic layer of a Heusler alloy. Furthermore, an RTA method is used to induce the semiconductor layer and the magnetic element layer to react with each other. However, other heat treatment methods may be used for that purpose.

Embodiment 4

Figure 9A:
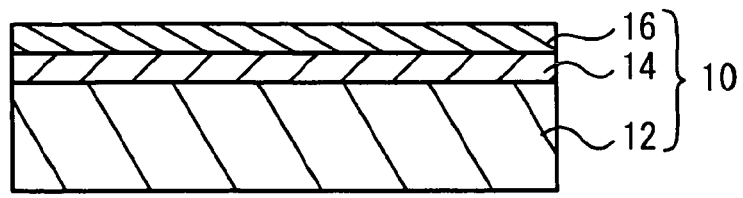
FIGS. 9(a) to 9(d) are diagrams showing a method of manufacturing a spin-transistor according to Embodiment 4.
Figure 9B:
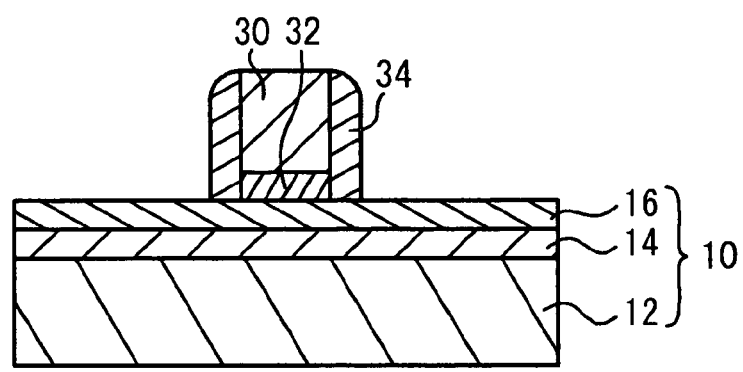
Figure 9C:
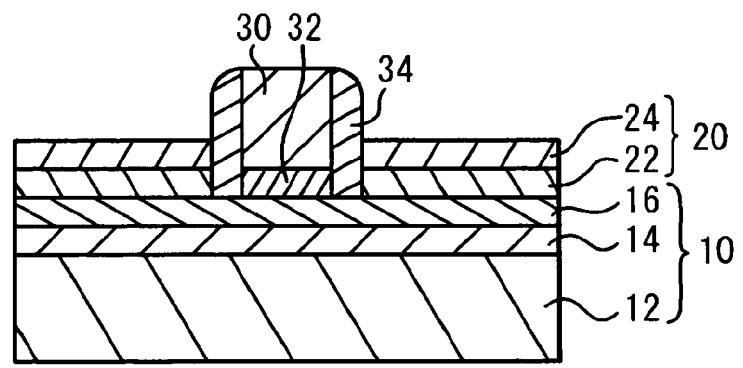
Figure 9D:
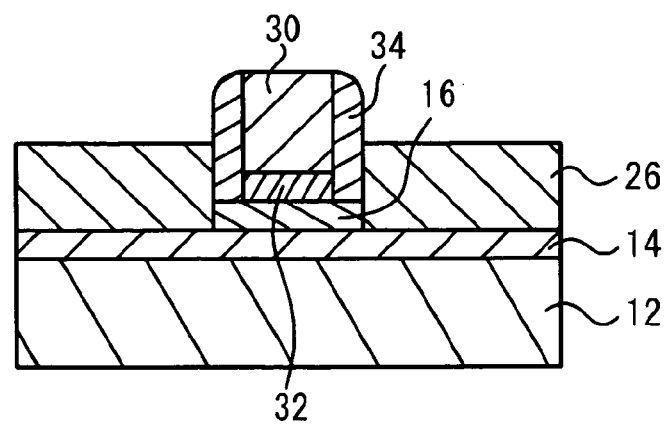

Embodiment 4 is an embodiment of manufacturing a spin-transistor with use of a Heusler alloy. FIGS. 9(a) to 9(d) are views showing a method of manufacturing a spin-transistor according to Embodiment 4. As with FIG. 3(a) of Embodiment 1, an SOI substrate 10 is prepared. Referring to FIG. 9(b), a gate electrode 30 is formed via a gate oxide film 32 on the SOI substrate 10 having a Si layer 16 (semiconductor layer) formed on a silicon oxide film 14 (inhibition layer). A sidewall 34 including an oxide film is formed on both sides of the gate electrode 30. Referring to FIG. 9(c), a magnetic element layer 20 including a Co layer 22 and an Fe layer 24 is formed on the Si layer 16 at both sides of an area for a channel by an evaporation method while the sidewall 34 is used as a mask. Referring to FIG. 9(d), an RTA method is used to induce the Si layer 16, the Co layer 22, and the Fe layer 24 to react with each other, so that a half-metallic ferromagnetic electrode of a Heusler alloy layer 26 is formed as a source electrode and a drain electrode on the silicon oxide film 14 at both sides of the area for the channel.

Referring to FIG. 9(d), in the spin-transistor according to Embodiment 4, the Si layer 16 (semiconductor channel layer) is provided as a channel on the silicon oxide layer 14 (inhibition layer). The Heusler alloy layer 26 is provided as a half-metallic ferromagnetic electrode on the silicon oxide layer 14 at both sides of the Si layer 16. When a spin-transistor is manufactured by the method of FIGS. 9(a) to 9(d), the Heusler alloy layer 26 contains Si, which is a semiconductor forming the semiconductor channel layer, and magnetic elements. Therefore, when the magnetization directions of the half-metallic ferromagnetic electrodes including the source electrode and the drain electrode are antiparallel to each other, the conductance decreases. When the magnetization directions of the half-metallic ferromagnetic electrodes including the source electrode and the drain electrode are parallel to each other, the conductance increases. Thus, a high magnetocurrent ratio can be obtained.

In Embodiment 4, a semiconductor layer located at both sides of a channel is used to form a Heusler alloy. However, at least one side of the channel may be used to form a Heusler alloy. Specifically, one of the source electrode and the drain electrode may be formed into a half-metallic ferromagnet of a Heusler alloy, whereas the other of those may be formed into a ferromagnetic material of an alloy other than a Heusler alloy. In Embodiment 4, the method of forming a ferromagnetic material as shown in Embodiment 1 is used to manufacture a spin-transistor. However, the methods of forming a ferromagnetic material as shown in Embodiments 2 and 3 may be used to manufacture a spin-transistor. In a case where a half-metallic ferromagnet is formed selectively in part of a semiconductor layer as in the method of manufacturing a spin-transistor of Embodiment 4, it is preferable to use the methods shown in Embodiments 1 to 3.

Embodiment 5

Figure 10A:
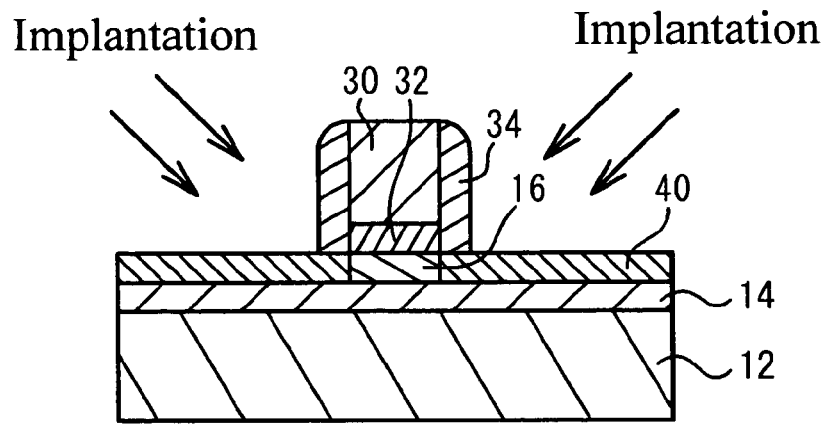
FIGS. 10(a) to 10(c) are diagrams showing a method of manufacturing a spin-transistor according to Embodiment 5.
Figure 10B:
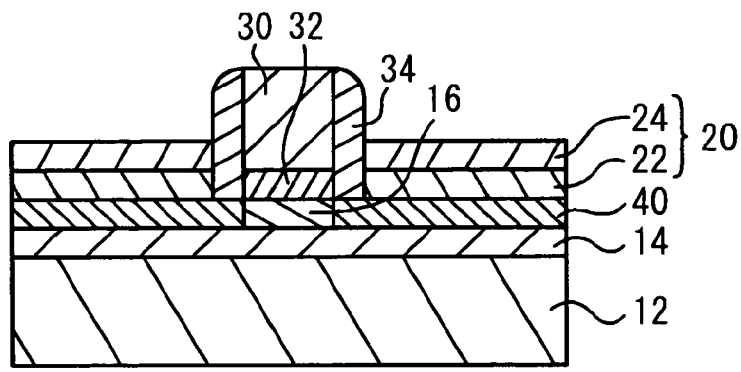
Figure 10C:
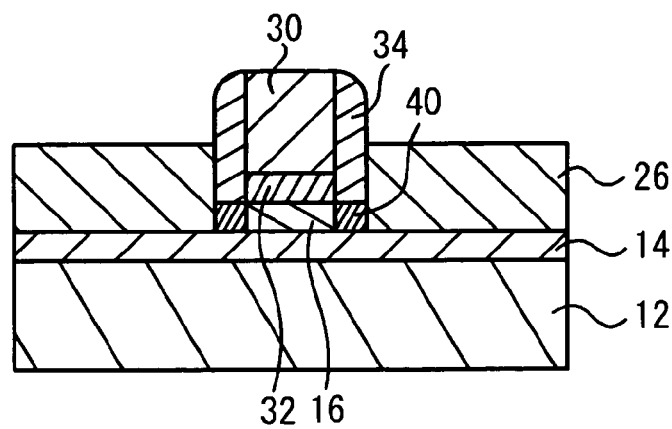

Embodiment 5 is an embodiment of forming low-resistance areas on both sides of a semiconductor layer as a channel. FIGS. 10(a) to 10(c) show a method of manufacturing a spin-transistor according to Embodiment 5. Referring to FIG. 10(a), impurities are ion-implanted in oblique directions after the process shown in FIG. 9(b) of Embodiment 4. Thus, impurities are implanted not only in an area to be a source and a drain, but also in the Si layer 16 below the sidewall 34. Thereafter, heat treatment is performed to form a highly-doped Si layer 40. In a case of an n-type channel device, As or P is used for ions to be implanted. That is, the highly-doped Si layer 40 becomes an n-type highly-doped layer. On the other hand, in a case of a p-type channel device, B is used for ions to be implanted. That is, the highly-doped Si layer 40 becomes a p-type highly-doped layer. Furthermore, instead of implantation in oblique directions, impurities may be ion-implanted into the Si layer 16 with use of the gate electrode 30 as a mask before the sidewall 34 is formed.

Referring to FIG. 10(b), a magnetic element layer 20 is formed in an area to be a source and a drain. Referring to FIG. 10(c), a Heusler alloy layer 26 is formed from the highly-doped Si layer 40, the Co layer 22, and the Fe layer 24, as with the process shown in FIG. 9(d) of Embodiment 4. At that time, the highly-doped Si layer 40 located below the sidewall 34 does not react. Therefore, the highly-doped Si layer 40 remains between the Si layer 16 of a semiconductor channel and the Heusler alloy layer 26 of a ferromagnetic electrode. Thus, a semiconductor area having a higher dopant concentration than the semiconductor channel can be formed with a low resistivity.

Referring to FIG. 9(d), according to Embodiment 4, the sidewall 34 is formed to prevent contact between the magnetic element layer 20 and the gate electrode 30. However, since the Si layer 16 remains below the sidewall 34, a parasitic resistance is generated in the source and the drain so as to lower the transistor performance (capability for driving current). According to Embodiment 5, since the highly-doped Si layer 40 is formed below the sidewall 34 as shown in FIG. 10(c), a source resistance and a drain resistance can be lowered so as to improve the transistor performance.

Embodiment 6

Figure 11:
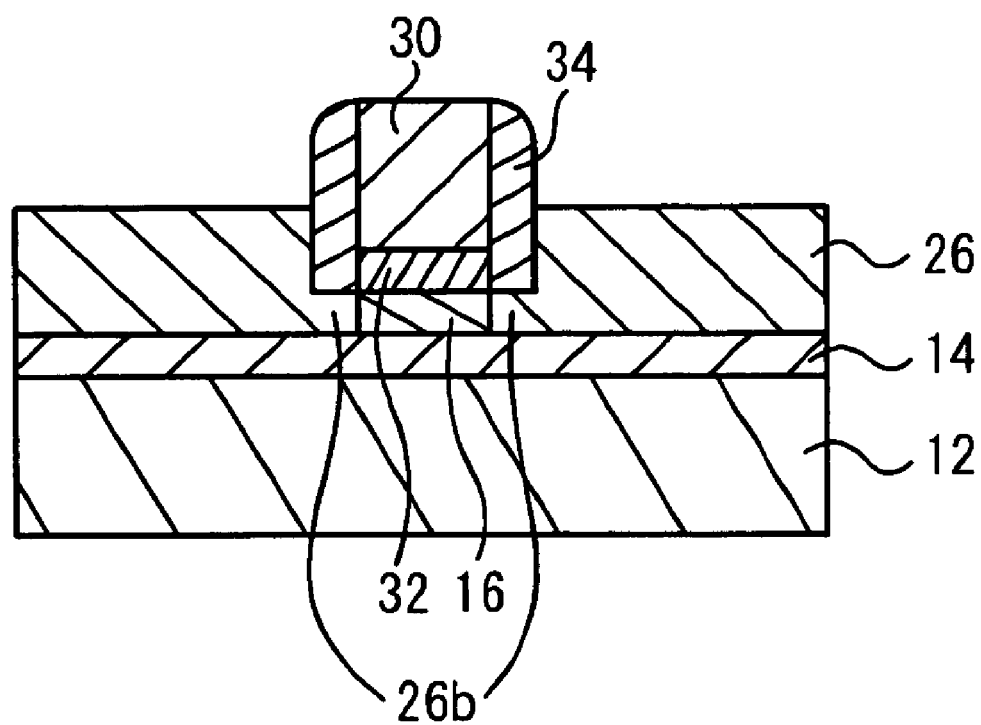
FIG. 11 is a diagram showing a method of manufacturing a spin-transistor according to Embodiment 6.

Embodiment 6 is an embodiment of forming a Heusler alloy so as to extend to a location below a sidewall. Referring to FIG. 11, when a Heusler alloy layer 26 is formed, an erosion reaction is used to form the Heusler alloy layer 26 such that the Heusler alloy layer 26 erodes a portion located below the sidewall 34. Thus, a ferromagnetic electrode is formed so as to extend to a location 26b below the sidewall 34. Therefore, a source resistance and a drain resistance can be lowered so as to improve the transistor performance.

Embodiment 7

Figure 12A:
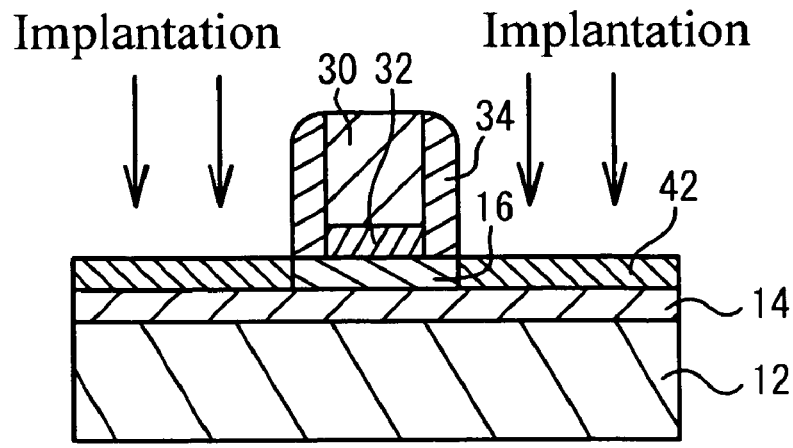
FIGS. 12(a) to 12(c) are diagrams showing a method of manufacturing a spin-transistor according to Embodiment 7.
Figure 12B:
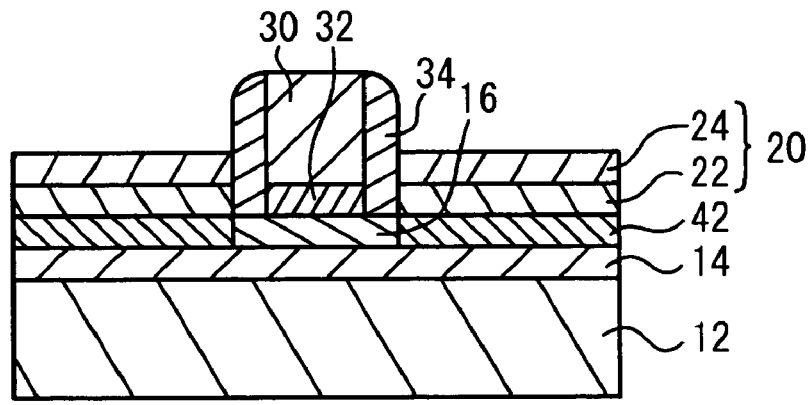
Figure 12C:
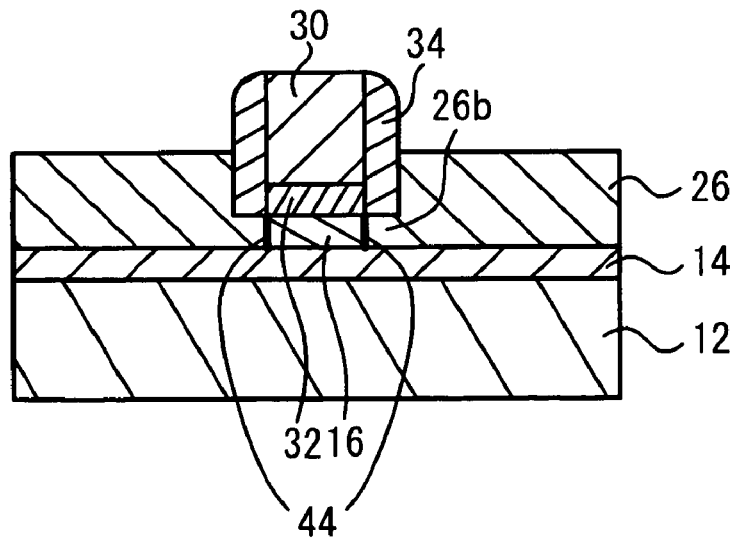

Embodiment 7 is an embodiment of forming a segregation layer when a Heusler alloy is formed. FIGS. 12(a) to 12(c) show a method of manufacturing a spin-transistor according to Embodiment 7. Referring to FIG. 12(a), impurities are ion-implanted after the process shown in FIG. 9(b) of Embodiment 4. Thus, impurities are implanted in the Si layer 16 at an area to be a source and a drain, so that an impurity-doped layer 42 is formed in the Si layer 16. In a case of an n-type channel device, As or P is used for ions to be implanted. On the other hand, in a case of a p-type channel device, B is used for ions to be implanted. Furthermore, the impurity-doped layer 42 may be a portion of the Si layer 16. Referring to FIG. 12(b), a magnetic element layer 20 is formed in the area to be a source and a drain without heat treatment.

Referring to FIG. 12(c), heat treatment using an RTA method is performed to form a Heusler alloy layer 26. At that time, impurities are segregated between the Si layer 16 of a semiconductor channel and the Heusler alloy layer 26, thereby forming a segregation layer 44. The segregation layer 44 can lower a Schottky barrier between the Si layer 16 and the Heusler alloy layer 26. Therefore, a source resistance and a drain resistance can be lowered so as to improve the transistor performance. In FIG. 12(c) of Embodiment 7, an erosion reaction is performed as with FIG. 11 of Embodiment 6. However, an erosion reaction may not be performed as with FIG. 9(d) of Embodiment 4.

As described above, a method of forming a Heusler alloy with use of a sputtering method or a molecular beam epitaxy method cannot be applied to a conventional manufacturing method used for a MOSFET. In Embodiments 4 to 7, on the other hand, a ferromagnetic electrode of a spin-transistor is formed of a silicide or a germanide of a metal in the same manner as in a formation process of a metal source and a metal drain of a MOSFET. Thus, an erosion reaction can be utilized as in Embodiment 6 for a ferromagnetic electrode by using a process similar to a conventional formation process of a metal source and a metal drain of a MOSFET. Furthermore, a segregation phenomenon can be used as in Embodiment 7.

In Embodiments 1 to 7, the ferromagnetic layer and the ferromagnetic electrode have been described as a half-metallic ferromagnet having a spin polarization of 100%. While it is preferable to have a spin polarization close to 100%, those ferromagnetic materials may have a spin polarization lower than 100%.

Although the preferred embodiments of the present invention have been described above, the present invention is not limited to those specific embodiments. It should be understood that various changes and modifications may be made therein without departing from the scope of the present invention defined in the claims.

The invention claimed is:

1. A method of forming a ferromagnetic material, comprising:
    forming a magnetic element layer on a semiconductor layer formed on an inhibition layer; and
    forming a ferromagnetic layer of a Heusler alloy on the inhibition layer by heat treatment to induce the semiconductor layer and the magnetic element layer to react with each other.

2. The method of forming a ferromagnetic material as recited in claim 1, wherein the semiconductor layer contains at least one of silicon and germanium.

3. The method of forming a ferromagnetic material as recited in claim 1, wherein the inhibition layer comprises a silicon oxide film.

4. The method of forming a ferromagnetic material as recited in claim 1, wherein the inhibition layer is formed by a silicon substrate, and the semiconductor layer contains germanium.

5. The method of forming a ferromagnetic material as recited in claim 1, wherein forming the magnetic element layer comprises forming the magnetic element layer selectively on the semiconductor layer, and
    forming the ferromagnetic layer comprises forming the ferromagnetic layer selectively on the inhibition layer.

6. A method of manufacturing a transistor, comprising:
    forming a magnetic element layer selectively on a semiconductor layer formed on an inhibition layer at one or both sides of an area to be a channel in the semiconductor layer; and
    forming a ferromagnetic electrode of a Heusler alloy on the inhibition layer by heat treatment to induce the semiconductor layer and the magnetic element layer to react with each other.

7. The method of manufacturing a transistor as recited in claim 6, wherein the semiconductor layer contains at least one of silicon and germanium.

8. The method of manufacturing a transistor as recited in claim 6, wherein the inhibition layer comprises a silicon oxide film.

9. The method of manufacturing a transistor as recited in claim 6, wherein the inhibition layer is formed by a silicon substrate, and the semiconductor layer contains germanium.

10. The method of manufacturing a transistor as recited in claim 6, wherein the ferromagnetic electrode comprises a source electrode and a drain electrode.

11. The method of manufacturing a transistor as recited in claim 6, further comprising forming a semiconductor area between the semiconductor channel and the ferromagnetic electrode, the semiconductor area containing a dopant at a concentration higher than that of the semiconductor channel.

12. The method of manufacturing a transistor as recited in claim 6, further comprising forming a segregation layer between the semiconductor channel and the ferromagnetic electrode.

13. The method of manufacturing a transistor as recited in claim 6, further comprising forming a gate electrode in an area to be the channel and a sidewall on both sides of the gate electrode,
    wherein forming a ferromagnetic electrode comprises forming the ferromagnetic electrode such that the ferromagnetic electrode extends so as to erode a portion located below the sidewall.

14. A transistor comprising:
    a semiconductor channel layer provided on an inhibition layer; and
    a ferromagnetic electrode provided on the inhibition layer at one or both sides of the semiconductor channel, the ferromagnetic electrode being formed of a Heusler alloy including a semiconductor constituting the semiconductor channel and a magnetic element.

15. The transistor as recited in claim 14, wherein the semiconductor layer contains at least one of silicon and germanium.

16. The transistor as recited in claim 14, wherein the inhibition layer comprises a silicon oxide film.

17. The transistor as recited in claim 14, wherein the inhibition layer is formed by a silicon substrate, and the semiconductor layer contains germanium.

18. The transistor as recited in claim 14, wherein the ferromagnetic electrode comprises a source electrode and a drain electrode.

19. The transistor as recited in claim 14, further comprising a semiconductor area between the semiconductor channel and the ferromagnetic electrode, the semiconductor area containing a dopant at a concentration higher than that of the semiconductor channel.

20. The transistor as recited in claim 14, further comprising a segregation layer between the semiconductor channel and the ferromagnetic electrode.

21. The transistor as recited in claim 14, further comprising a gate electrode provided on the semiconductor channel and a sidewall formed on both sides of the gate electrode,
    wherein the ferromagnetic electrode extends so as to erode a portion located below the sidewall.

* * * * *